(12) United States Patent
Gstrein et al.

(10) Patent No.: US 7,625,817 B2
(45) Date of Patent: Dec. 1, 2009

(54) METHOD OF FABRICATING A CARBON NANOTUBE INTERCONNECT STRUCTURES

(75) Inventors: Florian Gstrein, Portland, OR (US); Valery M. Dubin, Portland, OR (US); Juan E. Dominguez, Hillsboro, OR (US); Adrien R. Lavoie, St. Helens, OR (US)

(73) Assignee: Intel Corporation, Santa Clara, CA (US)

( * ) Notice: Subject to any disclaimer, the term of this patent is extended or adjusted under 35 U.S.C. 154(b) by 363 days.

(21) Appl. No.: 11/325,774

(22) Filed: Dec. 30, 2005

(65) Prior Publication Data

US 2007/0155158 A1 Jul. 5, 2007

(51) Int. Cl.
*H01L 21/4763* (2006.01)
(52) U.S. Cl. .............................. 438/618; 257/E21.575; 977/742; 977/750
(58) Field of Classification Search ................. 438/618, 438/666, 584, 597; 977/750, 734, 742, 700, 977/842, 845, 876; 257/E21.575, E21.627
See application file for complete search history.

(56) References Cited

U.S. PATENT DOCUMENTS 6,286,226 B1 * 9/2001 Jin .............................. 33/706
6,984,579 B2 * 1/2006 Nguyen et al. .............. 438/622
7,301,779 B2 * 11/2007 Honlein et al. .............. 361/772

OTHER PUBLICATIONS

Cao, A., et al., "Direction-selective and length-tunable in-plane growth of carbon nanotubes", Adv. Mater., 15(13), (Jul. 2003), 1105-1109.

Jung, Y. J., et al., "Mechanism of selective growth of carbon nanotubes on SiO2/Si patterns", American Chemical Society, Nano Letters, 3(4), (2003), 561-564.

Lim, B. S., et al., "Atomic layer deposition of transition metals", Nature Materials, 2, (Nov. 2003), 749-754.

Martensson, P., et al., "Atomic layer epitaxy of copper: Growth and selectivity in the Cu(II)-2,2,6,6-tetramethyl-3,5-haptanedionate/H2 process", J. Electrochem. Soc., 145(8), (Aug. 1998), 2926-2931.

Sloan, J., et al., "Integral atomic layer architectures of 1D crystals inserted into single walled carbon nanotubes", Chem. Commun., www.rsc.org/chemcomm, (2002), 1319-1332.

Wei, et al., "Organized assembly of carbon nanotubes", Nature, 416, (Apr. 2002), 495-496.

Ye, X., et al., "Supercritical fluid fabrication of metal nanowires and nanorods templated by multiwalled carbon nanotubes", Adv. Mater., 15(3), (Feb. 2003), 316-319.

* cited by examiner

*Primary Examiner*—Khiem D Nguyen
(74) *Attorney, Agent, or Firm*—Blakely, Sokoloff, Taylor & Zafman LLP

(57) ABSTRACT

A method including forming an interconnect of single-walled carbon nanotubes on a sacrificial substrate; transferring the interconnect from the sacrificial substrate to a circuit substrate; and coupling the interconnect to a contact point on the circuit substrate. A method including forming a nanotube bundle on a circuit substrate between a first contact point and a second contact point, the nanotube defining a lumen therethrough; filling a portion of a length of the lumen of the nanotube bundle with an electrically conductive material; and coupling the electrically conductive material to the second contact point. A system including a computing device comprising a microprocessor, the microprocessor coupled to a printed circuit board, the microprocessor including a substrate having a plurality of circuit devices with electrical connections made to the plurality of circuit devices through interconnect structures including carbon nanotube bundles.

2 Claims, 8 Drawing Sheets

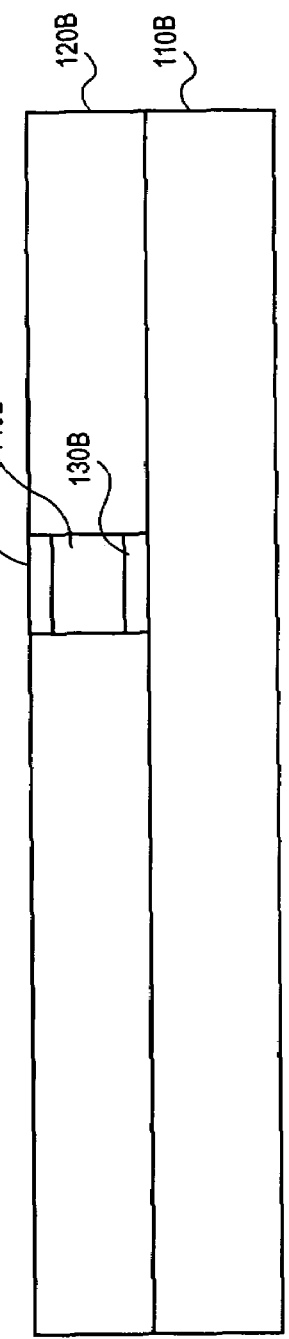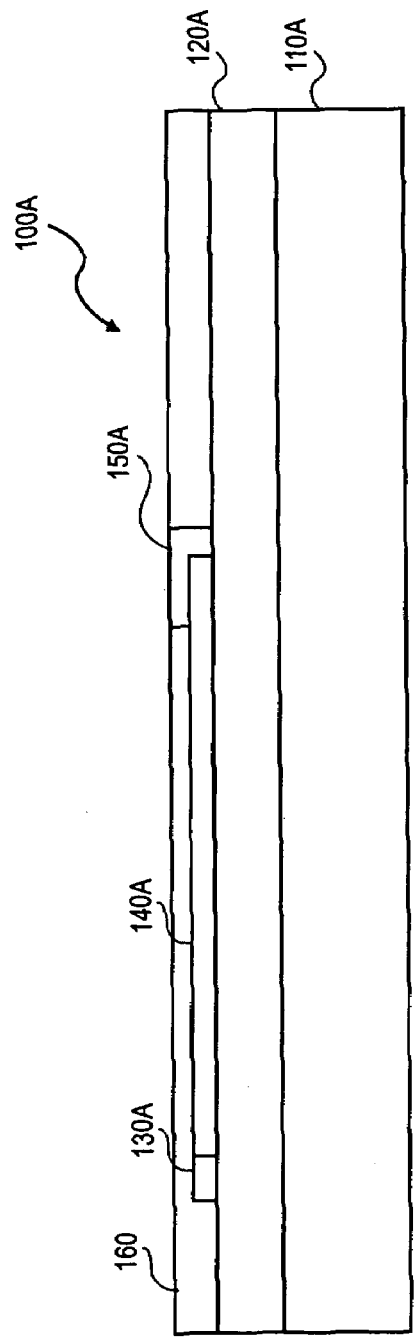
FIG. 4

METHOD OF FABRICATING A CARBON NANOTUBE INTERCONNECT STRUCTURES

BACKGROUND

1. Field

Nanotubes and integrated circuit processing

2. Description of Related Art

Modern integrated circuits use conductive interconnections to connect the individual devices on a chip or to send and/or receive signals external to the device(s). Common types of interconnections include copper and copper alloy interconnections (lines) coupled to individual devices, including other interconnections (lines) by interconnections through vias.

Nanotubes are generally seamless tubes of graphite sheets with full fullerene caps. Typically, the nanotubes are formed as multi-layer concentric tubes for multi-walled carbon nanotube bundles or as single-walled nanotube bundles. Nanotubes have shown promising applications in nano-scale electronic devices, high strength materials, and electron field emission tips for scanning probe microscopy.

BRIEF DESCRIPTION OF THE DRAWINGS

The features, aspects, and advantages of the invention will become more thoroughly apparent from the following detailed description, appended claims, and accompanying drawings in which:

FIG. 4 shows the two substrates following the deposition of a conductive material at a contact point for a nanotube bundle on each substrate.

DETAILED DESCRIPTION

Figure 1:
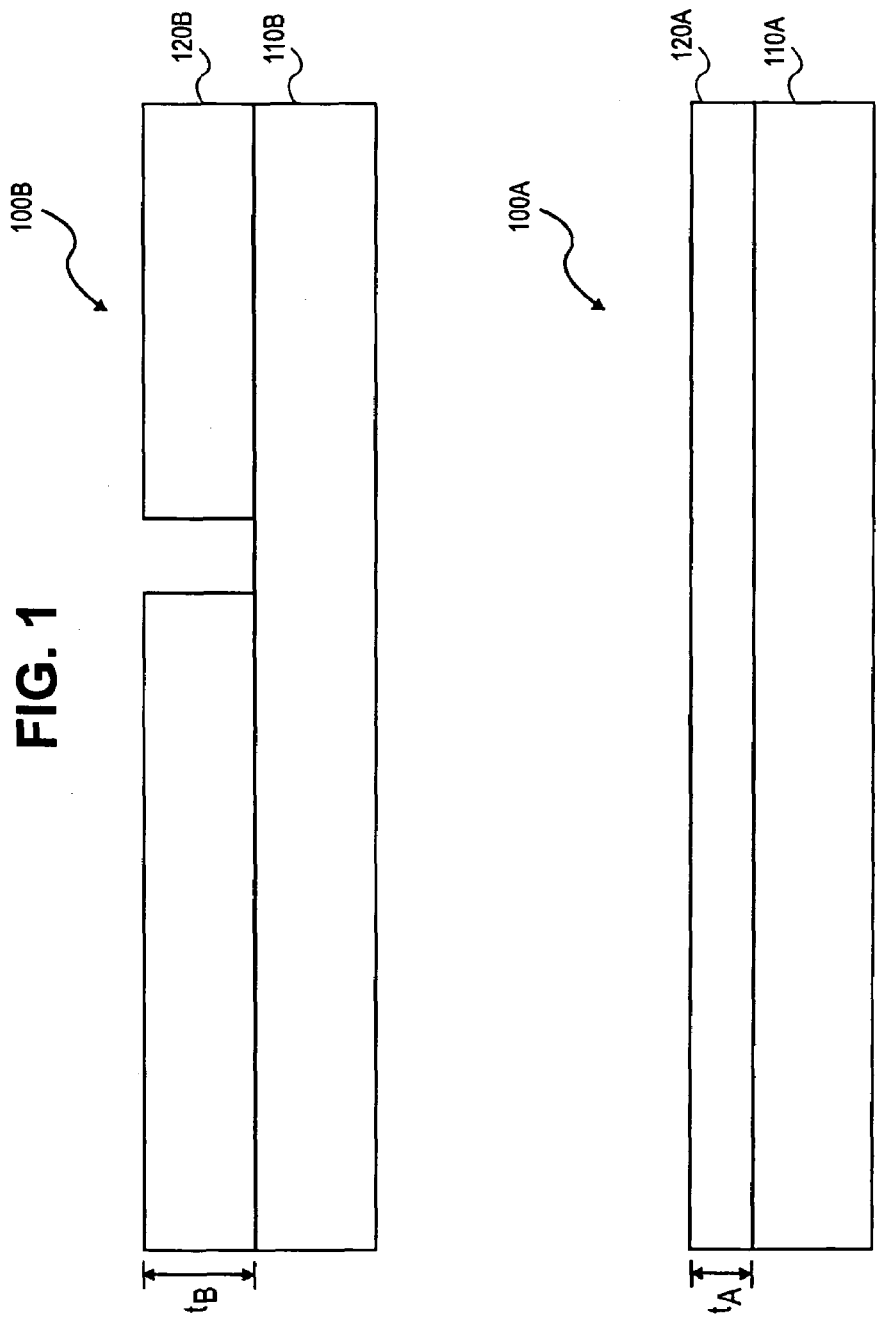
FIG. 1 shows two separate host substrates each having a dielectric material formed thereon.

FIG. 1 shows two hosts or sacrificial substrates that may serve as hosts for the formation of individual interconnection layers or levels disposed in dielectric material (e.g., interlayer dielectric material). As noted above, integrated circuits use conductive interconnections to connect individual devices on a chip or to send and/or receive signal external to the devices. A typical microprocessor chip may have a number of interconnection layers or levels stacked one on top of the other to accomplish the interconnections. Generally speaking, circuit devices and interconnections are formed at the wafer level. Accordingly, sacrificial substrate 110A and sacrificial substrate 110B may have a size suitable to accommodate a dielectric film that may be formed over a wafer as well as multiple interconnection lines that might be formed in individual layers on a wafer.

In one embodiment, substrate 110A and substrate 110B are each a material selected for a property such that a dielectric layer may be formed thereon and later separated from the sacrificial material. In one embodiment, sacrificial substrate is a silicon material, such as silicon formed into the shape of a wafer.

FIG. 1 shows sacrificial substrate 110A and sacrificial substrate 110B each having a layer of dielectric material formed on a surface thereof (a top surface as viewed). Dielectric layer 120A and dielectric layer 120B are each, for example, silicon dioxide ($SiO_2$) formed, for example, by a tetraethyl orthosilicate (TEOS) or a plasma enhanced chemical vapor deposition (PECVD) source. Carbon-doped silicon dioxide (CDO) may serve as another dielectric layer material. A material for dielectric layer 120A and/or dielectric layer 120B may also be a material having, for example, a dielectric constant less than the dielectric constant of $SiO_2$ (e.g., a "low k" material), including polymers as known in the art.

In the embodiment shown in FIG. 1, dielectric layer 120A has a thickness, $t_A$, less than a thickness, $t_B$, of dielectric layer 120B. In this representative example, a thickness of dielectric layer 120B is selected to accommodate a conductive via between a device layer and an interconnect line or between interconnect lines. In one embodiment, a suitable thickness is on the order of 35-200 nm. Dielectric layer 120A may have a thickness suitable to space an interconnect line from sacrificial substrate 110A but, in this example, no other criteria may be necessary. A representative thickness is on the order of 25-200 nm.

Referring to the structure shown in FIG. 1, in one embodiment, dielectric layer 120B has an opening or via formed through the dielectric layer to sacrificial substrate 110B. The opening may be formed using photolithographic and etch techniques to be suitable for the formation of a conductive via therein.

Figure 2:
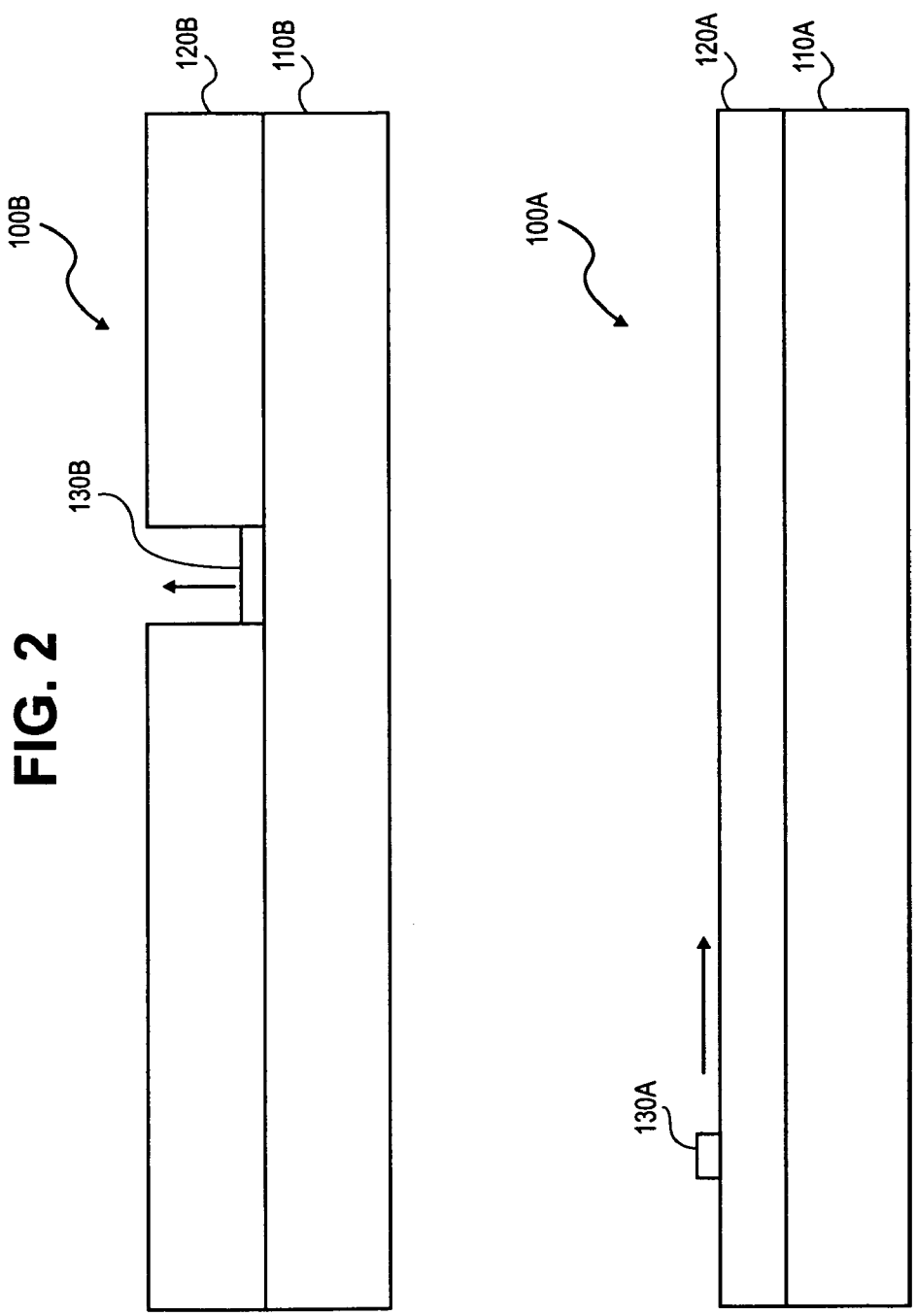
FIG. 2 shows the two substrates of FIG. 1 following the introduction of a catalyst of a substrate.

FIG. 2 shows the structures of FIG. 1 following the deposition of a catalyst on each structure. Referring to structure 100A, FIG. 1 shows catalyst 130A formed on an exposed surface (an upper surface as shown) of dielectric layer 120A. Structure 100B shows catalyst 130B formed in the via through dielectric layer 120B. In one embodiment, catalyst 130A and catalyst 130B are each a catalyst suitable for the formation of a single-walled nanotube bundle thereon (e.g., a single-walled carbon nanotube bundle). A material suitable as a catalyst for forming single-walled nanotubes are, for example, metals that can be supersaturated with carbon such as, but not necessarily limited to, iron, iron oxide, iron cobalt alloys, iron molybdenum alloys, iron and iron alloys that form composites or are supported on dielectrics such as silicon dioxide, magnesium oxide or aluminum oxide. A single-walled nanotube typically differs from a multi-walled nanotube in that a single-walled nanotube is composed of a single graphite sheet while a multi-walled nanotube may be composed of concentric cylinders formed around a common central hollow with spacing between layers close to the inner layer spacing of graphite. Single-walled carbon nanotubes generally require high temperature formation processing (e.g., 900° C. to 1100° C.) making such tube challenging for use as interconnects formed directly on circuit structures where high temperature processing might damage the underlying circuit structure.

In one embodiment, catalyst 130A and catalyst 130B determine a position of a subsequent interconnect structure and a gas flow determines the growth direction of the nanotube bundle. Referring to FIG. 2, a nanotube bundle formed on structure 100A, in one embodiment, will be grown in a lateral direction (to the right in the figure) while a nanotube bundle will be grown in the via on structure 100B. A suitable process gas for growing nanotube bundles from catalysts such as, iron or alloys of iron both with or without dielectric material support is: methane, ethylene, mixtures of methane and ethylene, carbon monoxide. Hydrogen and water and oxygen may serve as co-reactants.

Figure 3:
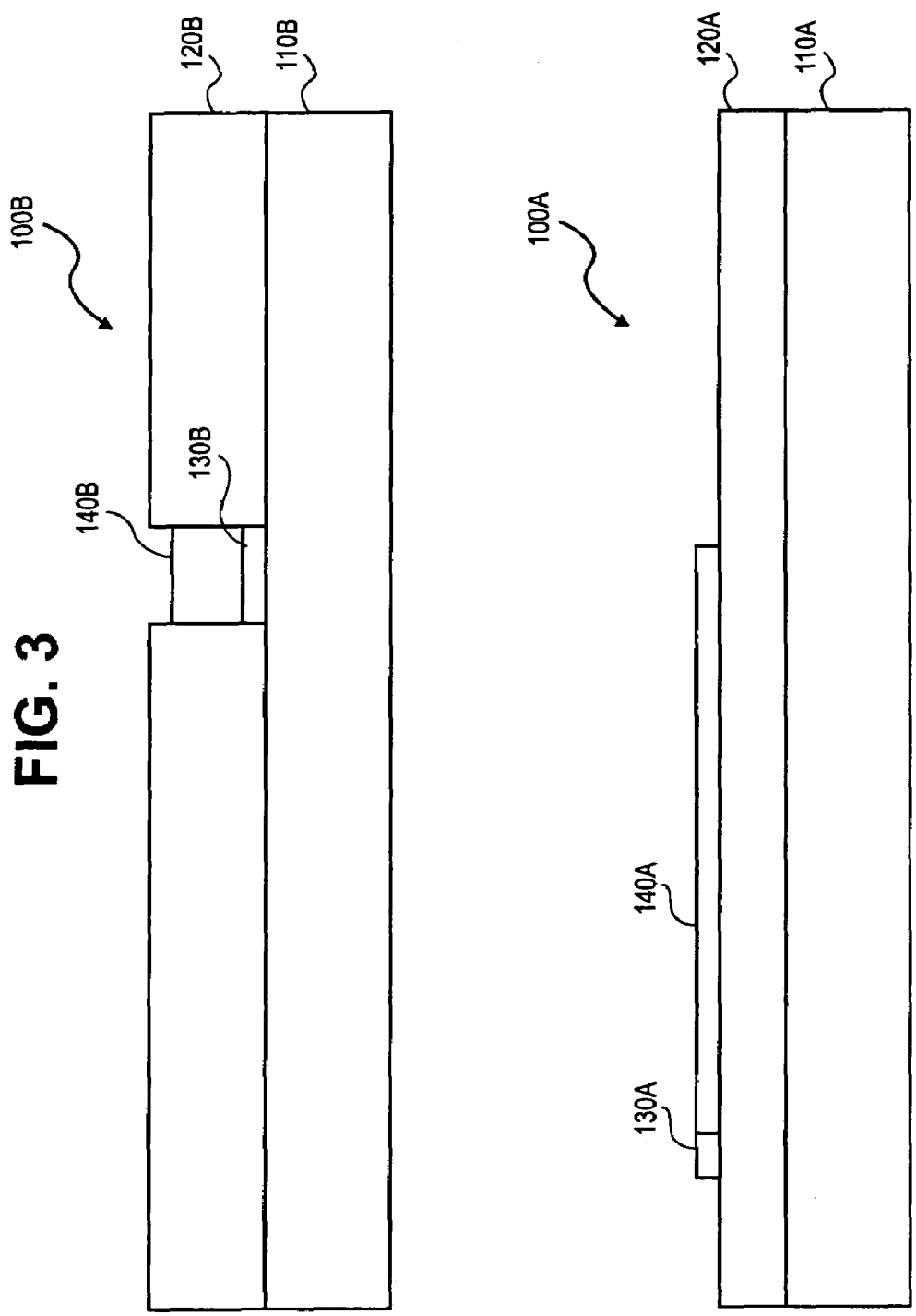
FIG. 3 shows the two substrates of FIG. 2 following the formation of single-walled nanotube bundles on each substrate.

FIG. 3 shows the structures of FIG. 2 following the growth of a nanotube bundle on each structure. FIG. 3 shows nanotube bundle 140A grown from catalyst 130A in a lateral direction and nanotube bundle 140B grown from catalyst 130B in a via in dielectric layer 120B. Nanotube bundle 140A is a bundle of nanotubes (for example a tightly packed bundle of single-walled carbon nanotubes) in that it consists of a number of nanotubes defining its circumference as well as its length. A representative diameter for a nanotube in the bundle that forms nanotube bundle 140A in FIG. 3 is one nanometer. A representative diameter of the nanotube bundle 140A as an interconnect is 20 to 100 nanometers. A representative length of the nanotube bundle 140A is on the order of one micrometer to one millimeter. A suitable diameter for nanotube bundle 140B is somewhat smaller but on the same order of magnitude. In one example, a length (measured in terms of depth of a via) of nanotube bundle 140B is 1.75 its diameter.

FIG. 4 shows the structures of FIG. 3 following the introduction or formation of a conductive material on each respective nanotube bundle. Referring to structure 100A, conductive material 150A is formed on nanotube bundle 140A at an end of the nanotube opposite catalyst 130A. Similarly, in structure 100B, conductive material 150B is formed on nanotube bundle 140B at an end opposite catalyst 130B. In one embodiment, a conductive material for conductive material 150A and conductive material 150B is selected as a suitable interconnect material (e.g., low resistance, etc.) that will allow a metal to metal bond between conductive material 150A and conductive material 150B. In one embodiment, a suitable material for conductive material 150A and conductive material 150B includes, but is not limited to, platinum, palladium, and copper. Representatively, an electroless palladium seed material may be formed on the nanotube followed by copper plating to form conductive material 150A and conductive material 150B.

In one embodiment, to form conductive material 150A on an end of nanotube bundle 140A, a seed material may be placed only at the end of the nanotube and subsequent plating of a material such as copper will be limited to the area where the area of the nanotube bundle includes the seed material. One way this may be accomplished is by depositing an additional layer of dielectric material conformally over a surface of dielectric layer 120A including the nanotube bundle. Following a conformal deposition, the dielectric material may be planarized. FIG. 4 shows dielectric material 160 of, for example, a material similar to the material for dielectric layer 120A formed over a surface of dielectric layer 120A including over nanotube bundle 140A. In one embodiment, a thickness of a layer of dielectric material 160 is suitable to encapsulate nanotube bundle 140A after planarization. Following planarization, an opening may be made using photolithographic and etching techniques at a position where it is desired to form conductive material on the nanotube. This may be followed by deposition of a seed material and plating of a conductive material.

In one embodiment, to form dielectric material 150B on nanotube bundle 140B, a seed layer may be deposited on nanotube bundle 140B followed by the electro-deposition of a material such as copper. The seed layer may be blanket deposited over a surface of dielectric layer 120B then polished from the surface to confine the seed material to the via.

Following the formation of conductive material 150A and conductive material 150B, the dielectric material containing the nanotube structures may be separated from sacrificial substrate 110A and sacrificial substrate 110B. One way to separate the dielectric material and interconnect structures from sacrificial substrate 110A and sacrificial substrate 110B is a "smart cut" delamination utilizing ion bombardment techniques, such as ion bombardment with hydrogen or argon and heating.

Figure 5:
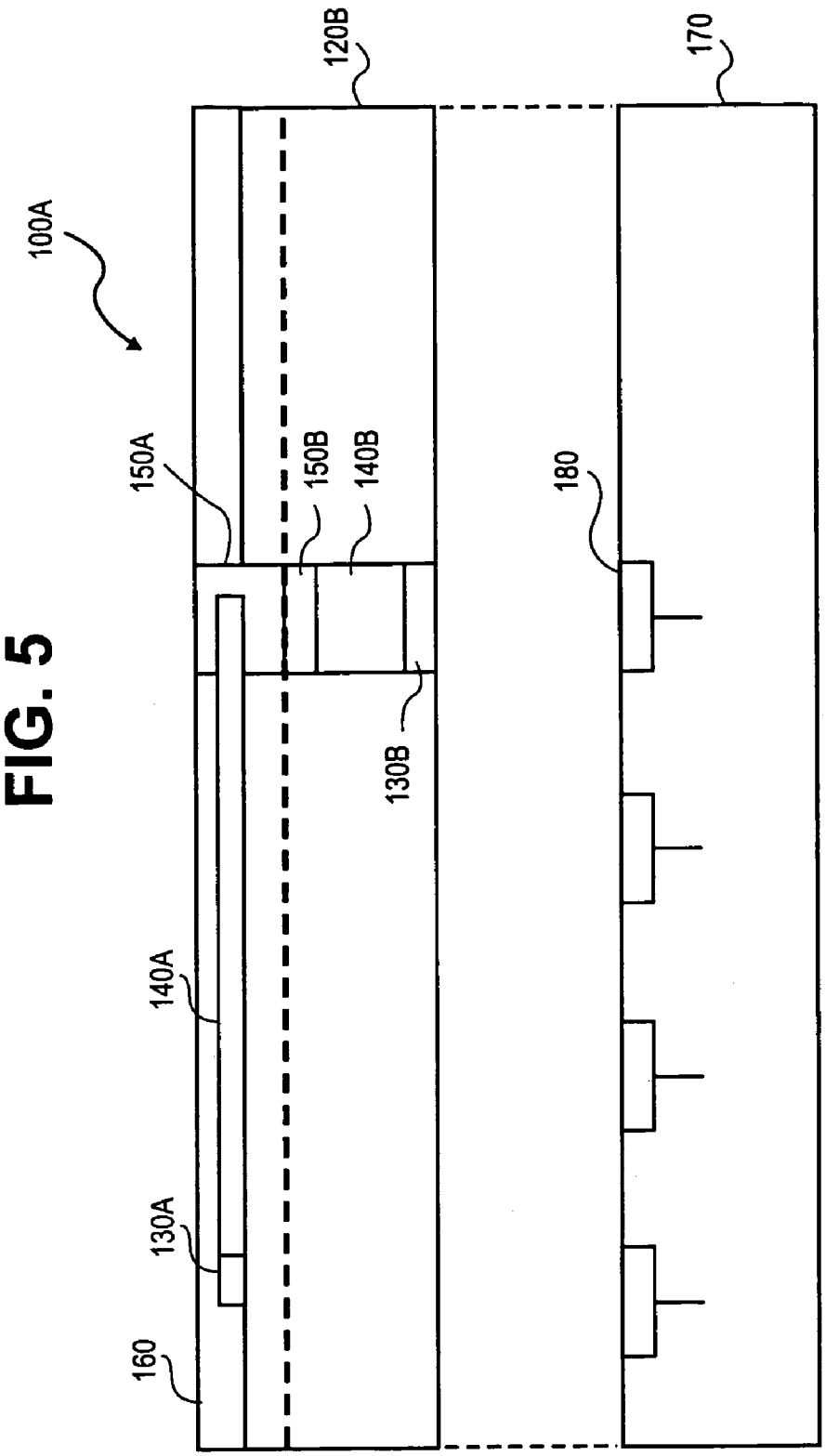
FIG. 5 shows the separation of the dielectric material and the nanotube bundle from each substrate and bonding of the conductive materials to connect the nanotubes from each substrate.

Following separation of the dielectric material and interconnect structures from sacrificial substrate 110A and sacrificial substrate 110B, the interconnect structures may be connected through bonding conductive material 150A to conductive material 150B (e.g., a metal-metal bond). The conductive materials may be bonded through a thermal technique. FIG. 5 shows the combined interconnect structure formed in joined dielectric layer 120A (including dielectric material for dielectric layer 120A and dielectric material 160) and dielectric layer 120B. FIG. 5 also shows the interconnect structures that were formed on/in the dielectric layers joined through a connection between conductive material 150A and conductive material 150B. As shown in this cross-sectional side view, nanotube bundle 140A may serve as an interconnect line with nanotube bundle 140B and conductive material 150A and conductive material 150B serving as a conductive via to the interconnect line. FIG. 5 representatively shows the combined dielectric layers including the interconnect structures over a substrate such as a circuit substrate (e.g., a portion of a wafer). The interconnect structures may be patterned to be coupled to a contact point on device 170. FIG. 5 shows contact point 180 that may be a portion of a circuit device (e.g., a transistor) or an interconnect (e.g., an underlying interconnect line or contact).

Figure 6:
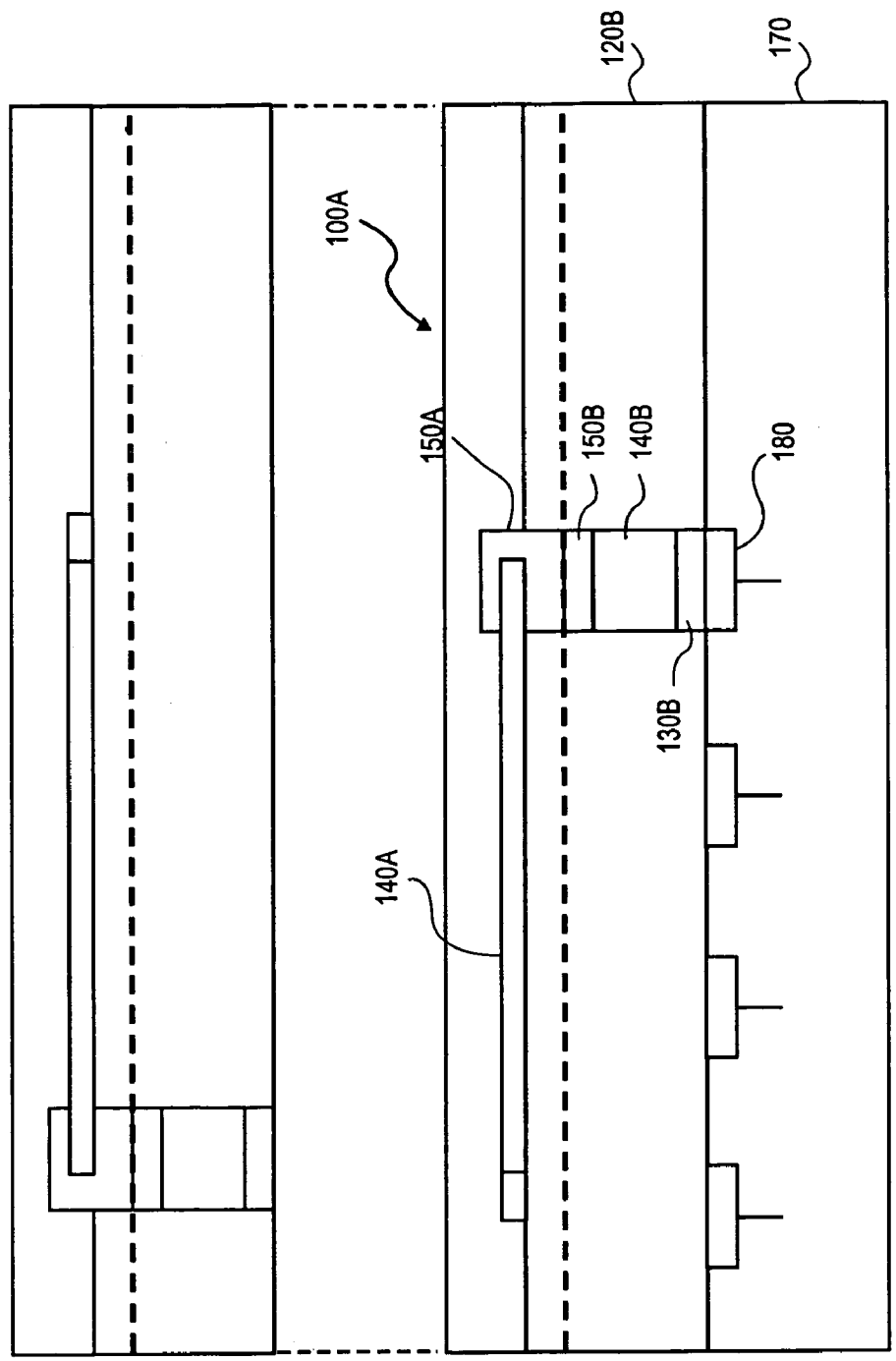
FIG. 6 shows the bonded dielectric layers including the nanotube bundles connected to a circuit substrate as interlayer dielectrics containing interconnects including the nanotubes.

FIG. 6 shows the structure of FIG. 5 following the connection of the combined dielectric layers including the interconnect structures to substrate 170, particularly connecting the combined interconnect structures to contact point 180 on substrate 170. FIG. 6 also illustrates the process described above with reference to FIGS. 1-5 may be repeated, where desired, for subsequent interconnect structures (e.g., conductive vias and/or line).

By utilizing sacrificial substrates to form interconnect structures, single-walled carbon nanotubes may be utilized as the interconnect structures. Experimental results indicate that a resistance of singled-walled carbon nanotubes compare favorably with predicted resistance of copper interconnects according to current technologies, with the resistance of the nanotubes being an order of magnitude better than the resistance of copper interconnects for technologically relevant interconnect links.

FIGS. 7-13 describe another technique of forming an interconnect structure using carbon nanotubes. In this technique, a multi-walled carbon nanotube is used as a portion of an interconnect. In one aspect the nanotubes are exploited for their atomically flat surface to define an interface for a metal conductor. The nanotube/metal interface will tend to produce less interface scattering compared to that produced with a typical dielectric/metal interface. The nanotube also serves as a highly defined barrier material around the metal interconnect and may decrease oxidation of the metal.

Figure 7:
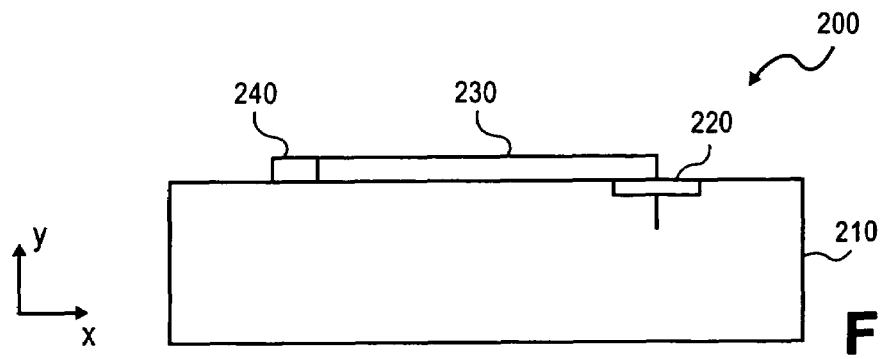
FIG. 7 shows a cross-sectional side view of a circuit substrate in an xy direction having a nanotube bundle formed on a surface thereof.

FIG. 7 shows a cross-sectional side view of a portion of a circuit substrate, such as a portion of a wafer having circuit devices formed thereon/therein. FIG. 7 shows structure 200 including substrate 210 and contact point 220 on a surface of substrate 210 (a top surface as viewed). Contact point 220 may be a conductive contact to a device on substrate 210 (e.g., a transistor device) or a via formed to an underlying interconnect.

Figure 8:
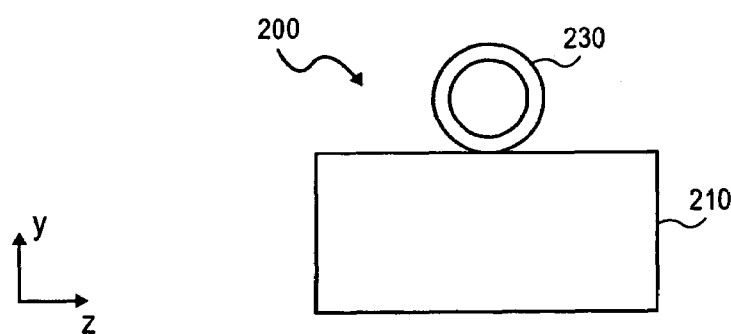
FIG. 8 shows the structure of FIG. 7 from a yz cross section.

Overlying a surface of substrate 210 (a top surface as viewed) is carbon nanotube bundle 230. In one embodiment, nanotube bundle 230 is a multi-walled carbon nanotube formed of a dimension suitable to define a volume for an interconnect line on a circuit substrate. Multi-walled carbon nanotubes such as nanotube bundle 230 can be deposited using various methods. One method involves catalytic conversion of gaseous hydrocarbon precursors (e.g., xylene) in the presence of a gaseous iron pre-catalyst (ferrocene) at silicone dioxide ($SiO_2$) nodules. FIG. 7 shows nodule or a catalyst 240 from which nanotube bundle 230 is formed. As shown in FIG. 7, nanotube bundle 230 is formed in a lateral (x direction). One technique to control the directionality of the formation of nanotube bundle 230 is to render undesirable formation directions catalytically inactive with a metal (e.g., gold) or other material positioned next to the module. A size of nodule 240 may be selected to predetermine a dimension (e.g., diameter) of nanotube bundle 230. FIG. 8 shows a cross-sectional view of structure 200, including nanotube bundle 230, in a yz direction.

Figure 9:
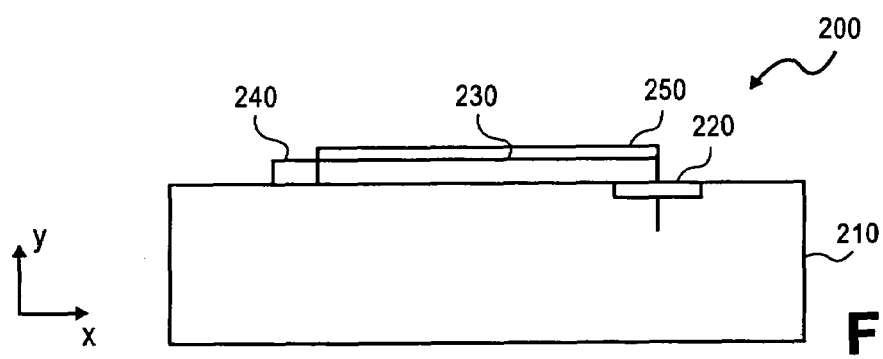
FIG. 9 shows the structure of FIG. 7 following the coating of a material on the nanotube bundle.
Figure 10:
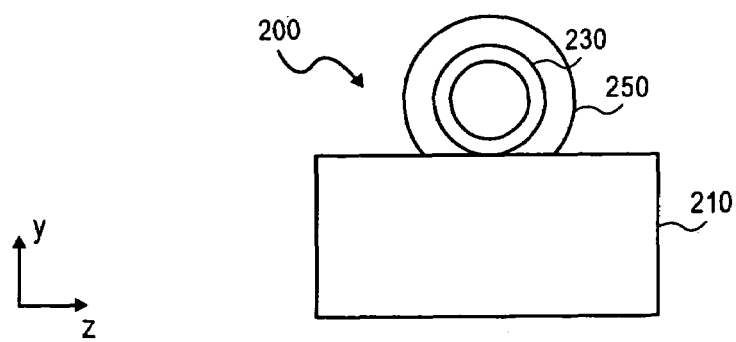
FIG. 10 shows the structure of FIG. 9 in a yz direction.

FIG. 9 shows structure 200 following the coating of nanotube bundle 230 with a barrier material. In one embodiment, nanotube bundle 230 is coated with a non-conductive material that will have a tendency to limit a subsequent deposition of a conductive material onto the nanotube periphery. FIG. 9 shows barrier material 250 of, for example, non-conductive materials such as tantalum nitride, tungsten nitride, or aluminum oxide coating nanotube bundle 230. The outer surface of the nanotube bundle 230 can also be plasma treated (for example, in a plasma containing hydrogen) to avoid subsequent nucleation of a conductive material. FIG. 10 shows structure 200 in a yz direction and further illustrates barrier material 250 coating a periphery of nanotube bundle 230.

Figure 11:
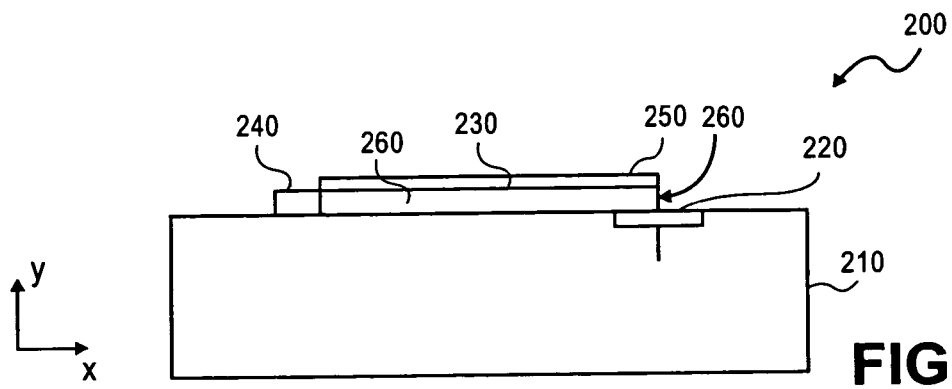
FIG. 11 shows the structure of FIG. 9 following the filling of a core of the nanotube bundle with a conductive material.
Figure 12:
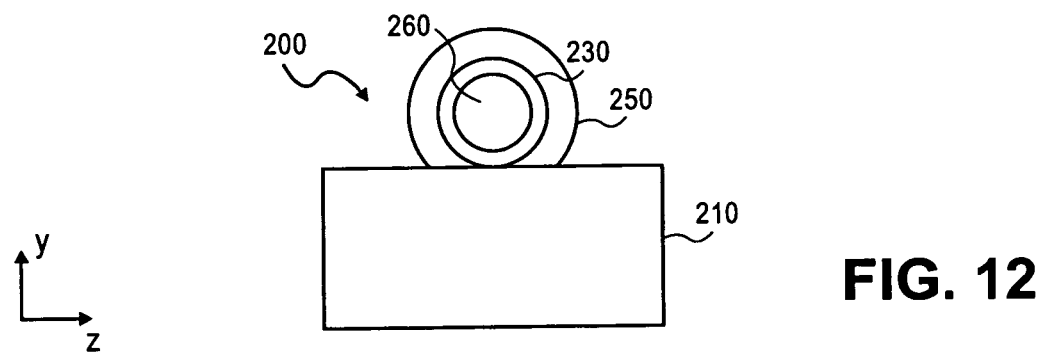
FIG. 12 shows the structure of FIG. 11 in a yz plane.

FIG. 11 shows structure 200 following the filling of a portion of an interior of nanotube bundle 230 (e.g., an entire portion) with an electrically conductive material such as a metal material to incorporate an electrical conductor into the core of nanotube bundle 230. FIG. 11 shows conductive material 260 filling a portion, including an entire portion of conductive material 260. FIG. 12 shows a cross section of structure 200 in a yz direction and shows conductive material 260 filling a core of nanotube bundle 230 on substrate 210.

A core of a carbon nanotube, such as nanotube bundle 230, may be filled with a variety of transition metals including, though not limited to, palladium (Pu), platinum (Pt), copper (Cu), rhodium (Rh), ruthenium (Ru), gold (Au), osmium (Os), silver (Ag), iridium (Ir), molybdenum (Mo), tungsten (W), manganese (Mn), rhenium (Re), cobalt (Co), nickel (Ni) and other refractory metal compounds from D-block elements including groups 3-11 in the Period Table of the Elements. Tertiary and quaternary alloys including, but not limited, cobalt boron phosphorous (CoBP), cobalt phosphorous (CoP), cobalt tungsten phosphorus (CoWP), cobalt rhenium phosphorous (CoReP), nickel boron phosphorous (NiBP), nickel phosphorous (NiP), nickel boron (NiB), nickel tungsten phosphorus (NiWP), nickel rhenium phosphorous (NiReP), nickel rhenium boron phosphorus (NiReBP), cobalt nickel boron phosphorous (CoNiBP), cobalt nickel tungsten phosphorous (CoNiWP) and cobalt nickel rhenium phosphorus (CoNiReP) may also be employed.

A variety of techniques may be employed to fill a core of nanotube bundle 230 including electroless deposition, electroplating, atomic layer deposition (ALD) or chemical vapor deposition (CVD). Complete surface conformality and coverage is expected with ALD as it is a surface-limited deposition method. To minimize any diffusion limited non-coverage of nanotube bundle 230, the nanotube bundle can be aligned nearly perpendicular to a reactant flow, the flow of precursor and co-reactants can be from different directions, and/or the nanotubes may be held freely (e.g., over an edge of sample). With respect to fill techniques employing CVD or ALD of a material such as platinum metal, precursor chemistries such as, though not limited to, beta-diketonates, cyclopentadienyl, arynes, allyls, or carbonyls may be used with an appropriate co-reactant such as oxygen or hydrogen. Metal CVD and ALD precursors may include, but are not limited to, inorganic and organometalic compounds such as 1,1,1,5,55-hexafluro-2,4-pentanedionato)Pd; bis(2,4-dimethylpentadienyl)Ru; $M(acac)_2$, where M is Cu, Ni, Pd, Pt; M(diisopropylacetamidinato, where M is Ni, Cu, Co, Ag, lanthanum (La); $MeCpptMe_3$, where Me is methyl and Cp is cyclopentadienyl; $Ru(octandionate)_2$; $Pd(hfac)_2$; $Cp_2Ru$, where Cp is cyclopentadienyl; $Cp_2Os$, where Cp is cyclopendienyl; silver chloride (AgCl); silver carbonate ($Ag_2CO_3$); silver acetate ($AgCOOCH_3$); silvercyclohexanebutyrate ($Ag[OOC(CH_2)_3C_6H_{11}]$); nickel carbonyl ($Ni(CO)_4$); hydrogen tetrabromoaurate ($HAuBr_4$); gold cyanide (AuCN); and gold chloride (AuCl). Materials derived from these compounds may also be suitable (e.g., process-dependent transformations).

Nanotube bundle 230 may also be filled using electro/electroless plating methods of metals such as, though not limited to, ruthenium (Ru), cobalt (Co) and nickel (Ni). Another technique for filling nanotube bundle 230 that may be employed a polymeric immobilized palladium (PIP) process.

Figure 13:
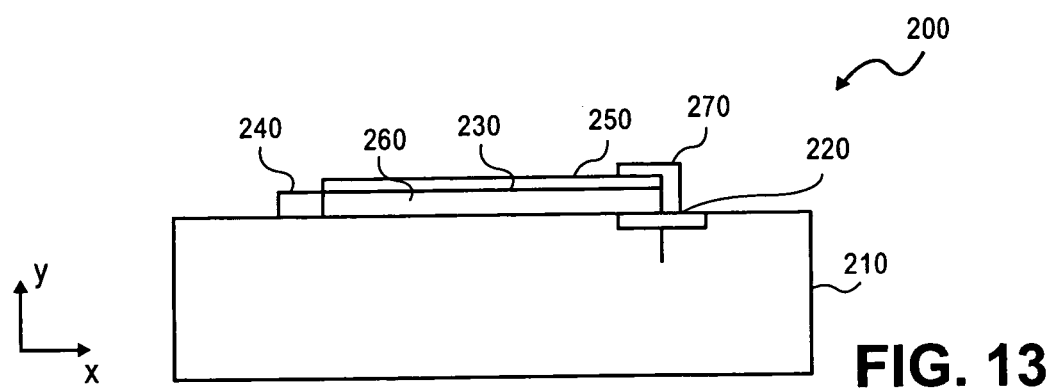
FIG. 13 shows the structure of FIG. 11 following the deposition of a conductive material on the nanotube to a contact point on the substrate.

FIG. 13 shows structure 200 following the deposition of a conductive material to connect metal material 260 in a core of nanotube bundle 230 with contact point 220. In this embodiment, a suitable metal is, for example, a transition metal such as might be used to fill nanotube bundle 230. In this embodiment, conductive material 260 within nanotube bundle 230 may be described as an interconnect line connected to contact point 220 through conductive material 270. Subsequent vias and/or interconnects of similar filled nanotube structures may be formed to the interconnect line defined by carbon nanotube bundle 230 and conductive material 260 or to other devices on/in substrate 210.

In the embodiment described with reference to FIGS. 7-13, a multi-walled carbon nanotube bundle was utilized as a template for forming an interconnect. Multi-walled nanotubes may be formed according to techniques suitable for back side processing on circuit substrates, because such nanotubes may be formed at temperatures below, for example, 500° C. In an alternative embodiment, a single-walled nanotube bundle may be employed as the conduit for an interconnect structure. One technique to utilize a single-walled nanotube bundle to use the sacrificial substrate technique described above with reference to FIGS. 1-6 and then filling the nanotube bundle as described, for example, with reference to FIGS. 11-12.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
    forming a first interconnect comprising a single-walled carbon nanotube in or on a first dielectric layer on a sacrificial substrate and a second interconnect comprising a single-walled carbon nanotube in or on a second dielectric layer on a sacrificial substrate;
    transferring the first interconnect, the first dielectric layer, the second interconnect and the second dielectric from the sacrificial substrate to a circuit substrate;

coupling one of the first interconnect and the second interconnect to a contact point on the circuit substrate; and coupling the first interconnect to the second interconnect to form a conductive path through the first interconnect and the second interconnect.

2. The method of claim 1, further comprising coupling a first electrically conductive material to the first interconnect and coupling a second electrically conductive material to the second interconnect and coupling the second interconnect to the first interconnect comprises coupling the second electrically conductive material to the first electrically conductive material.

* * * * *

UNITED STATES PATENT AND TRADEMARK OFFICE
CERTIFICATE OF CORRECTION

PATENT NO. : 7,625,817 B2
APPLICATION NO. : 11/325774
DATED : December 1, 2009
INVENTOR(S) : Gstrein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 699 days.

Signed and Sealed this

Twenty-first Day of December, 2010

David J. Kappos
*Director of the United States Patent and Trademark Office*